United States Patent
Yamamoto et al.

(10) Patent No.: US 8,492,867 B2
(45) Date of Patent: Jul. 23, 2013

(54) SEMICONDUCTOR DEVICE INCLUDING CELL REGION AND PERIPHERAL REGION HAVING HIGH BREAKDOWN VOLTAGE STRUCTURE

(75) Inventors: Kensaku Yamamoto, Toyokawa (JP); Naohiro Suzuki, Anjo (JP); Hidefumi Takaya, Miyoshi (JP); Masahiro Sugimoto, Toyota (JP); Jun Morimoto, Nisshin (JP); Narumasa Soejima, Seto (JP); Tsuyoshi Ishikawa, Nisshin (JP); Yukihiko Watanabe, Nagoya (JP)

(73) Assignees: DENSO CORPORATION, Kariya (JP); Toyota Jidosha Kabushiki Kaisha, Aichi-pref. (JP)

( * ) Notice: Subject to any disclaimer, the term of this patent is extended or adjusted under 35 U.S.C. 154(b) by 106 days.

(21) Appl. No.: 13/164,246

(22) Filed: Jun. 20, 2011

(65) Prior Publication Data

US 2011/0309464 A1    Dec. 22, 2011

(30) Foreign Application Priority Data

Jun. 22, 2010    (JP) ................................ 2010-141744

(51) Int. Cl.
*H01L 21/20* (2006.01)
(52) U.S. Cl.
USPC ........................................................ 257/493
(58) Field of Classification Search
USPC .................. 257/493, 391–394, 491
See application file for complete search history.

(56) References Cited

U.S. PATENT DOCUMENTS

| | | | | |
|---|---|---|---|---|
| 4,238,278 | A * | 12/1980 | Antipov | 438/426 |
| 5,648,670 | A * | 7/1997 | Blanchard | 257/329 |
| 5,877,528 | A * | 3/1999 | So | 257/341 |
| 5,949,124 | A * | 9/1999 | Hadizad et al. | 257/496 |
| 6,054,752 | A * | 4/2000 | Hara et al. | 257/629 |
| 6,069,385 | A * | 5/2000 | Blanchard | 257/332 |
| 6,388,286 | B1* | 5/2002 | Baliga | 257/330 |
| 6,413,822 | B2* | 7/2002 | Williams et al. | 438/270 |
| 6,576,952 | B2* | 6/2003 | Hshieh et al. | 257/328 |
| 7,075,145 | B2* | 7/2006 | Williams et al. | 257/329 |
| 7,265,024 | B2* | 9/2007 | Hsieh et al. | 438/424 |
| 7,557,395 | B2* | 7/2009 | Ma et al. | 257/288 |
| 8,084,327 | B2* | 12/2011 | Sapp | 438/270 |
| 2009/0045413 | A1 | 2/2009 | Ishii et al. | |
| 2010/0084663 | A1 | 4/2010 | Ishii et al. | |

* cited by examiner

*Primary Examiner* — Nathan Ha
(74) *Attorney, Agent, or Firm* — Posz Law Group, PLC

(57) ABSTRACT

A semiconductor device includes a semiconductor substrate and an electric field terminal part. The semiconductor substrate includes a substrate, a drift layer disposed on a surface of the substrate, and a base layer disposed on a surface of the drift layer. The semiconductor substrate is divided into a cell region in which a semiconductor element is disposed and a peripheral region that surrounds the cell region. The base region has a bottom face located on a same plane throughout the cell region and the peripheral region and provides an electric field relaxing layer located in the peripheral region. The electric field terminal part surrounds the cell region and a portion of the electric field relaxing layer and penetrates the electric field relaxing layer from a surface of the electric field relaxing layer to the drift layer.

15 Claims, 12 Drawing Sheets

SEMICONDUCTOR DEVICE INCLUDING CELL REGION AND PERIPHERAL REGION HAVING HIGH BREAKDOWN VOLTAGE STRUCTURE

CROSS REFERENCE TO RELATED APPLICATIONS

The present application is based on and claims priority to Japanese Patent Application No. 2010-141744 filed on Jun. 22, 2010, the contents of which are incorporated in their entirety herein by reference.

BACKGROUND OF THE INVENTION

1. Field of the Invention

The present invention relates to a semiconductor device that includes a cell region in which a semiconductor element is disposed and a peripheral region surrounding the cell region and having a high breakdown voltage structure.

2. Description of the Related Art

JP-A-11-74524 (corresponding to U.S. Pat. No. 6,054,752) and JP-A-2007-165604 (corresponding to U.S. Pat. No. 2009/0045413 A1) disclose high breakdown voltage structures formed in a peripheral region surrounding a cell region in which a semiconductor element such as a vertical power MOSFET and a diode is formed. FIG. 13 is a cross-sectional view of a high breakdown voltage structure formed in a peripheral region of a semiconductor device disclosed in JP-A-11-74524.

As shown in FIG. 13, the semiconductor device includes an n type drift layer 101, a p type layer 102 disposed on the n type drift layer 101, a recess section 103, and an electric field relaxing layer 104 having a p type. The recess section 103 forms a mesa structure and the electric field relaxing layer 104 is disposed on a sidewall and a bottom of the mesa structure. The recess section 103 for forming the mesa structure is provided from the p type layer 102 into the n type drift layer 101. At a stepped portion of the mesa structure, the electric field relaxing layer 104 is disposed from a surface of the p type layer 102 to a surface of the n type drift layer 101 in the recess section 103. By forming the electric field relaxing layer 104, equipotential lines gently extend toward a peripheral region, and an electric field concentration is relaxed. Thus, a breakdown voltage can be improved.

The high breakdown voltage structures disclosed in JP-A-11-74524 and JP-A-2007-165604 have a discontinuous point where materials having different conductivity types are connect with each other at a portion being in contact with the electric field relaxing layer and a bending portion at which an electric field relaxing layer is bent. For example, in the high breakdown voltage structure disclosed in JP-A-11-74524, a discontinuous point where an n type semiconductor connects with a p type semiconductor is located at a region R1 in FIG. 13, and a bending portion of the electric field relaxing layer is located at a region R2 in FIG. 13. Thus, the electric field may concentrate at the regions R1 and R2, and the breakdown voltage may be reduced.

SUMMARY OF THE INVENTION

In view of the foregoing problems, it is an object of the present invention to provide a semiconductor device that includes a peripheral region having a high breakdown voltage structure.

A semiconductor device according to an aspect of the present invention includes a semiconductor substrate and an electric field terminal part. The semiconductor substrate includes a substrate, a drift layer of a first conductivity type disposed on a surface of the substrate, and a base layer of a second conductivity type disposed on a surface of the drift layer. The semiconductor substrate is divided into a cell region in which a semiconductor element is disposed and a peripheral region that surrounds the cell region. The base region has a bottom face located on a same plane throughout the cell region and the peripheral region. A portion of the base region located in the peripheral region provides an electric field relaxing layer. The electric field terminal part is disposed in the peripheral region and surrounds the cell region and a portion of the electric field relaxing layer. The electric field terminal part penetrates the electric field relaxing layer from a surface of the electric field relaxing layer to the drift layer.

In the above-described semiconductor device, the electric field relaxing layer is provided by a portion of the base layer having a flat bottom face. Thus, the electric field relaxing layer does not have a bending portion. In addition, because the drift layer is only semiconductor being in contact with the electric field relaxing layer, there is no discontinuous point where materials having different conductivity types are connected with each other. Accordingly, a breakdown voltage of the semiconductor device can be improved.

BRIEF DESCRIPTION OF THE DRAWINGS

Additional objects and advantages of the present invention will be more readily apparent from the following detailed description of preferred embodiments when taken together with the accompanying drawings. In the drawings.

DETAILED DESCRIPTION OF THE PREFERRED EMBODIMENTS

First Embodiment

Figure 1:
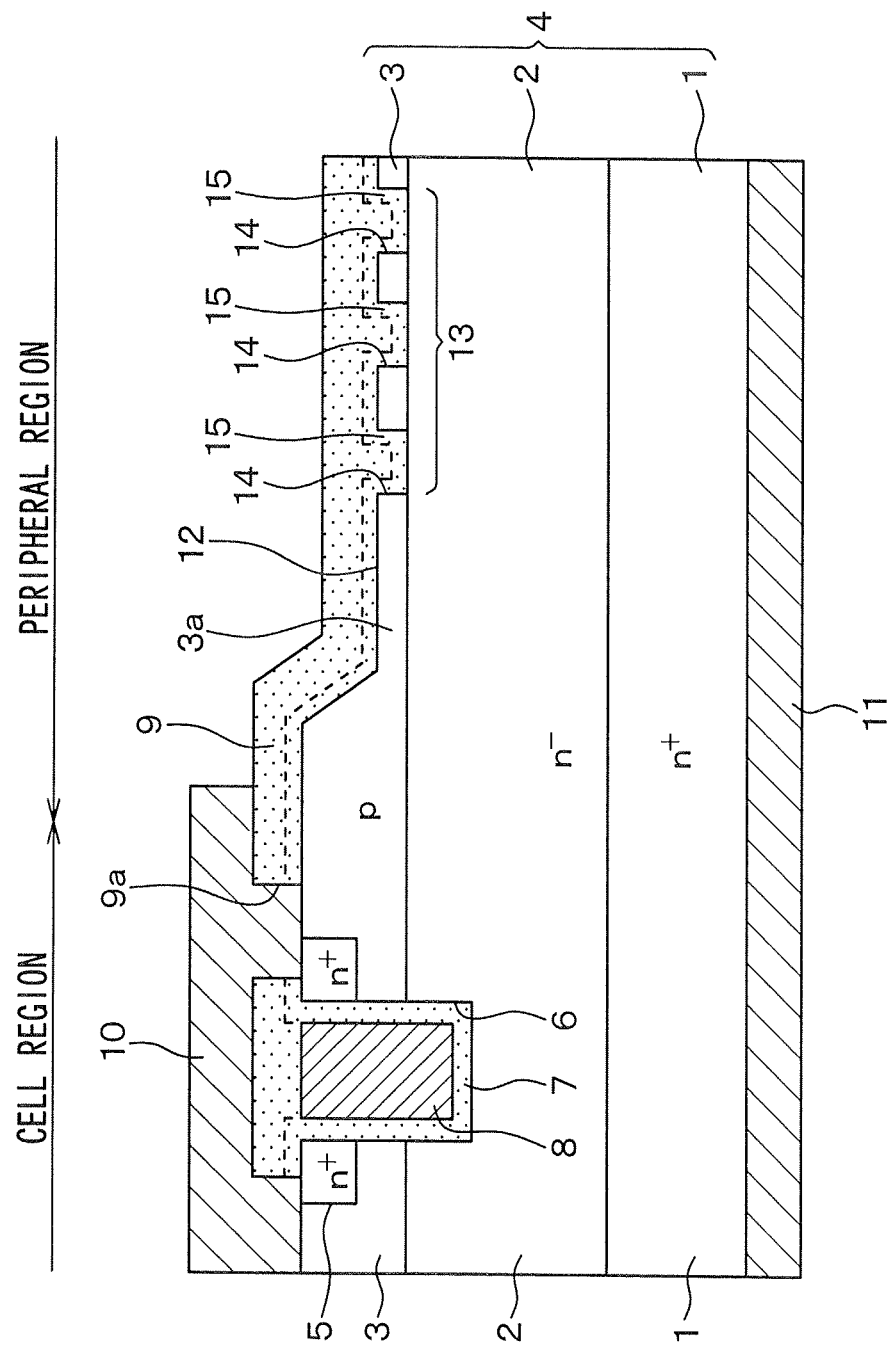
FIG. 1 is a cross-sectional view of a SiC semiconductor device according to a first embodiment.

A first embodiment of the present invention will be described. In the present embodiment, a SiC semiconductor device in which an n channel type vertical power MOSFET is formed in a cell region as a semiconductor element will be described. FIG. 1 is a cross-sectional view of the SiC semiconductor device according to the present embodiment. A configuration of the SiC semiconductor device according to the present embodiment will be described below with reference to FIG. 1.

As shown in FIG. 1, the SiC semiconductor device includes the cell region in which the vertical power MOSFET is formed and a peripheral region surrounding the cell region and having a high breakdown voltage structure. Although only a part of the cell region and the peripheral region in the SiC semiconductor device is shown in FIG. 1, the cell region is located at a center portion of the SiC semiconductor device and the peripheral region surrounds the cell region.

The SiC semiconductor device includes a semiconductor substrate 4. The semiconductor substrate 4 includes an n+ type substrate 1, an n− type drift layer 2, and a p type base layer 3. The n+ type substrate 1 has an impurity concentration of, for example, greater than or equal to $1\times10^{19}$ cm$^{-3}$. The n− type drift layer 2 has a lower impurity concentration than the n+ type substrate 1. For example, the n− type drift layer 2 has an impurity concentration of from $1\times10^{15}$ cm$^{-3}$ to $5\times10^{16}$ cm$^{-3}$. The p type base layer 3 has an impurity concentration of, for example, from $1\times10^{16}$ cm$^{-3}$ to $5\times10^{18}$ cm$^{-3}$. All of the n+ type substrate 1, the n− type drift layer 2, and the p type base layer 3 are made of SiC, which is wide gap semiconductor.

The semiconductor substrate 4 is divided into the cell region and the peripheral region. In the cell region, an n+ type source region 5 having a higher impurity concentration than the n− type drift layer 2 is disposed. For example, the n+ type source region 5 has an impurity concentration of from $1\times10^{18}$ cm$^{-3}$ to $5\times10^{20}$ cm$^{-3}$. In addition, on a front-surface side of the semiconductor substrate 4, a trench 6 penetrates the n+ type source region 5 and the p type base layer 3 to the n− type drift layer 2. A gate insulating layer 7 is disposed so as to cover an inner wall of the trench 6. On a surface of the gate insulating layer 7, a gate electrode 8 made of doped polysilicon is disposed. An interlayer insulating layer 9 made of, for example, an oxide layer, is disposed so as to cover the gate electrode 8, and a source electrode 10 is disposed on the interlayer insulating layer 9. The source electrode 10 is electrically coupled with the n+ type source region 5 and the p type base layer 3 through a contact hole 9a provided in the interlayer insulating layer 9.

On a rear-surface side of the semiconductor substrate 4 including the cell region, that is, on an opposite side of the n+ type substrate 1 from the n− type drift layer 2, a drain electrode 11 is disposed. The vertical power MOSFET has the above-described configuration. Although only one cell of the vertical power MOSFET is shown in FIG. 1, a plurality of cells of the vertical power MOSFET shown in FIG. 1 is disposed in the cell region. The gate electrode 8 is electrically coupled with an external device through a contact hole provided in the interlayer insulating layer 9 on a cross section different from the cross section shown in FIG. 1.

In the semiconductor substrate 4, the p type base layer 3 extends from the cell region into the peripheral region. The p type base layer 3 has a flat bottom face located on the same plane throughout the cell region and the peripheral region. In the present embodiment, a portion of the p type base layer 3 located in the peripheral region provides an electric field relaxing layer 3a.

In the peripheral region, a recess section 12 is formed by removing a portion of the p type base layer 3 from the surface of the p type base layer 3 so as to form a mesa structure. The recess section 12 for forming the mesa structure is shallower than the p type base layer 3. A thickness of the p type base layer 3 that remain under the recess section 12 is determined in accordance with the impurity concentration of the p type base layer 3. For example, when the p type base layer 3 has an impurity concentration of $1\times10^{17}$ cm$^{-3}$, the thickness of the p type base layer 3 that remains under the recess section 12 is greater than or equal to 0.4 μm.

The cell region and a portion of the electric field relaxing layer 3a are surrounded by an electric field terminal part 13. The electric field terminal part 13 is located on the bottom face of the recess section 12 for forming the mesa structure. Specifically, the electric field terminal part 13 is disposed at a distance of from 1 μm to 1000 μm from a stepped portion of the recess section 12 adjacent to the cell region. The electric field terminal part 13 penetrates the electric field relaxing layer 3a from the surface of the electric field relaxing layer 3a to the n− type drift layer 2, and thereby the electric field relaxing layer 3a is divided.

In the present embodiment, the electric field terminal part 13 includes a plurality of grooves 14 penetrating the electric field relaxing layer 3a from the surface of the electric field relaxing layer 3a to the n− type drift layer 2 and an insulating member 15 disposed in the grooves 14. The gate insulating layer 7 and the interlayer insulating layer 9 formed in the cell region extends to the peripheral region, and a part of the gate insulating layer 7 and the interlayer insulating layer 9 provides the insulating member 15. The grooves 14 concentrically surround the cell region and a portion of the electric field relaxing layer 3a. In other words, the electric field terminal part 13 according to the present embodiment includes a plurality of portions located at equal intervals, and each portion has a frame shape concentrically surrounding the cell region.

The distance from the stepped portion of the recess section 12 to the electric field terminal part 13 may be determined optionally. However, a misalignment of a mask may affect the cell region when the distance is less than 1 μm, and a chip size is large when the distance is greater than 10000 μm. Thus, it is preferable that the distance from the stepped portion of the recess section 12 to the electric field terminal part 13 is from 1 μm to 10000 μm.

In this way, in the SiC semiconductor device according to the present embodiment, the electric field relaxing layer 3a for forming a high breakdown voltage structure is provided by the portion the p type base layer 3 located in the peripheral region. Thus, the electric field relaxing layer 3a does not have a bending portion. Furthermore, because the n− type drift layer 2 is only semiconductor being in contact with the electric field relaxing layer 3, there is no discontinuous point where materials having different conductivity types are connected with each other. Accordingly, the breakdown voltage of the SiC semiconductor device can be further improved.

Figure 2A:
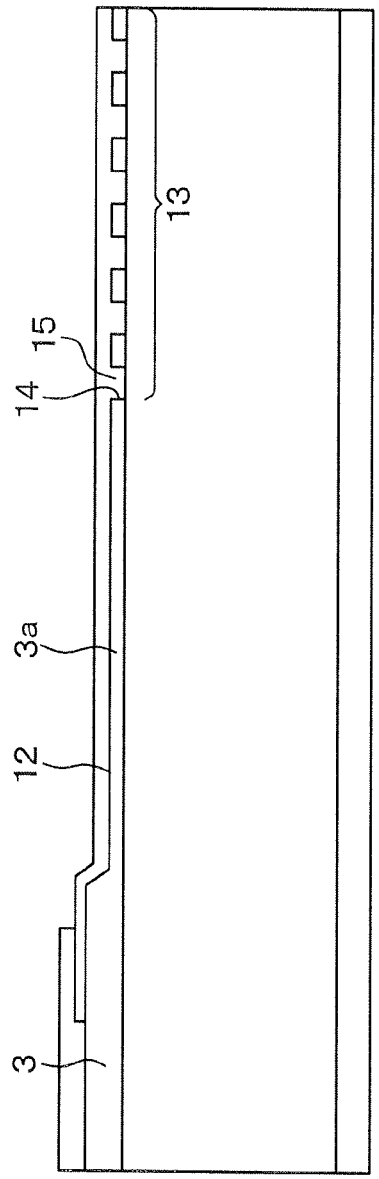
FIG. 2A is a cross-sectional view of a SiC semiconductor device according to the first embodiment used as a simulation model.
Figure 2B:
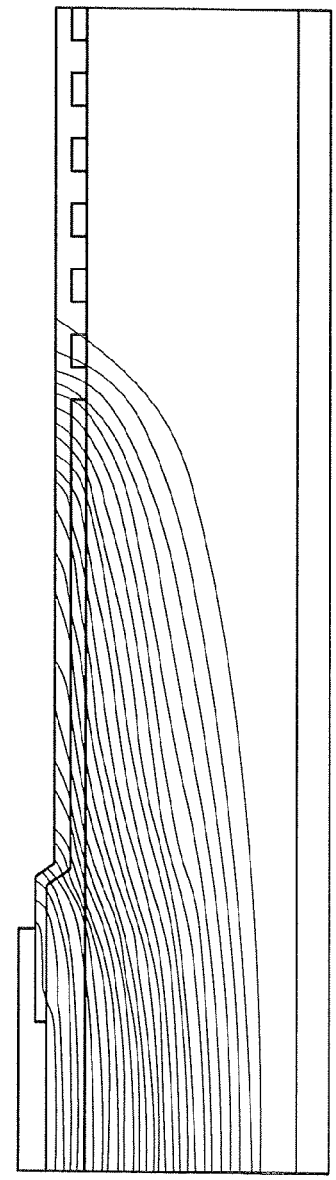
FIG. 2B is a diagram showing a distribution of equipotential lines at a breakdown of the model shown in FIG. 2A.
Figure 3:
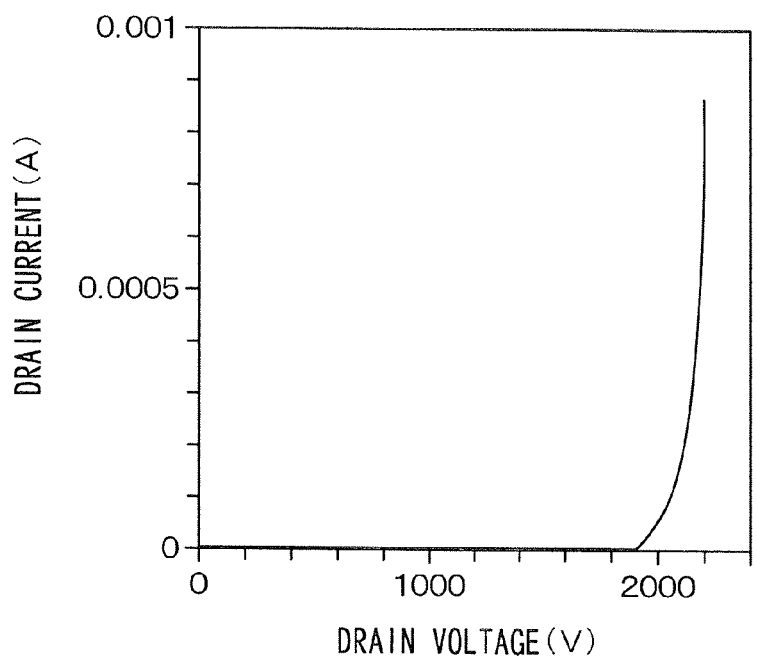
FIG. 3 is a graph showing a relationship between a drain voltage and a drain current at reverse bias.

FIG. 2A, FIG. 2B, and FIG. 3 are diagrams showing simulation results of the breakdown voltage of a SiC semiconductor device according to the present embodiment.

FIG. 2A is a cross-sectional view of a SiC semiconductor device according to the present embodiment used as a simulation model. FIG. 2B is a diagram showing a distribution of equipotential lines at a breakdown of the model shown in FIG. 2A. In the simulation, the n− type drift layer 2 has an impurity concentration of $5\times10^{15}$ cm$^{-3}$, and the p type base layer 3 and the electric field relaxing layer 3a have an impurity concentration of $1\times10^{17}$ cm$^{-3}$. In FIG. 2B, the equipotential lines are shown at intervals of 70 V.

As shown in FIG. 2, the equipotential lines at the breakdown expand widely without bias and terminate at the electric field terminal part 13. A PN junction by the electric field relaxing layer 3a and the n− type drift layer 2 forms a depletion layer, and the equipotential lines are expanded toward the peripheral region by the depletion layer. Thus, the equipotential lines expand widely in the peripheral region without bias. This means that electric field is generated without bias and electric field concentration does not occur. If distortion occurs at a portion of the equipotential lines, electric field concentration occurs at the portion. However, in the simulation result shown in FIG. 2B, there is no distortion. Thus, it can be considered that electric field concentration does not occur. Also from the simulation result, it can be confirmed that the breakdown voltage is further improved.

FIG. 3 is a graph showing a relationship between a drain voltage and a drain current at reverse bias. As shown in FIG. 3, the drain current is not generated in cases where a drain voltage is less than 1900 V. Thus, the SiC semiconductor device is not broken down until the drain voltage reaches 1900 V.

Figure 4:
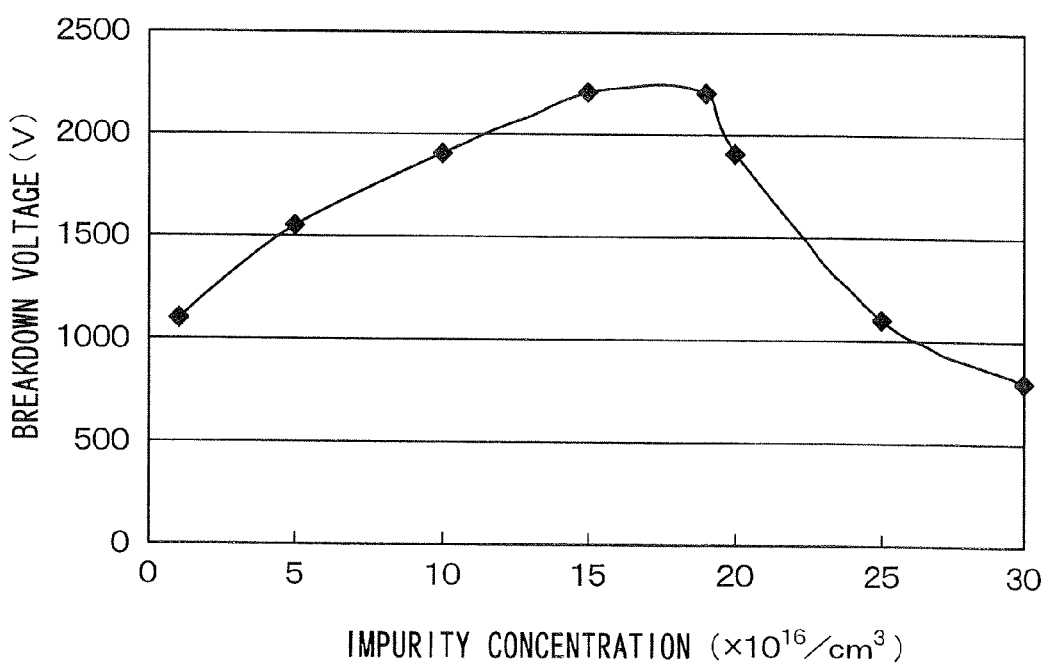
FIG. 4 is a graph showing a relationship between an impurity concentration of a p type base layer and an electric field relaxing layer and a breakdown voltage.

FIG. 4 is a graph showing a relationship between the impurity concentration of the p type base layer 3 and the electric field relaxing layer 3a and a breakdown voltage of the model shown in FIG. 2A. As shown in FIG. 4, the breakdown voltage changes with the impurity concentration of the p type base layer 3 and the electric field relaxing layer 3a. The SiC semiconductor device is designed so as to have a breakdown voltage of, for example, greater than or equal to 1200 V. When the impurity concentration of the electric field relaxing layer 3a is greater than or equal to $1\times10^{16}$ cm$^{-3}$, the breakdown voltage can be greater than or equal to 1200 V.

However, when the impurity concentration of the electric field relaxing layer 3a is too high, the breakdown voltage is reduced. As described above, the equipotential lines expand as shown in FIG. 2B because the depletion layer is formed by the PN junction by the electric field relaxing layer 3a and the n− type drift layer 2. When the impurity concentration of the electric field relaxing layer 3a is too high, a width of the depletion layer expanding in the electric field relaxing layer 3a is reduced, and the breakdown voltage is reduced. An upper limit of the impurity concentration of the electric field relaxing layer 3a is $2.5\times10^{17}$ cm$^{-3}$. Thus, when the impurity concentration of the electric field relaxing layer 3a is from $1\times10^{16}$ cm$^{-3}$ to $2.5\times10^{17}$ cm$^{-3}$, a breakdown voltage of greater than or equal to 1200 V can be achieved.

Figure 5:
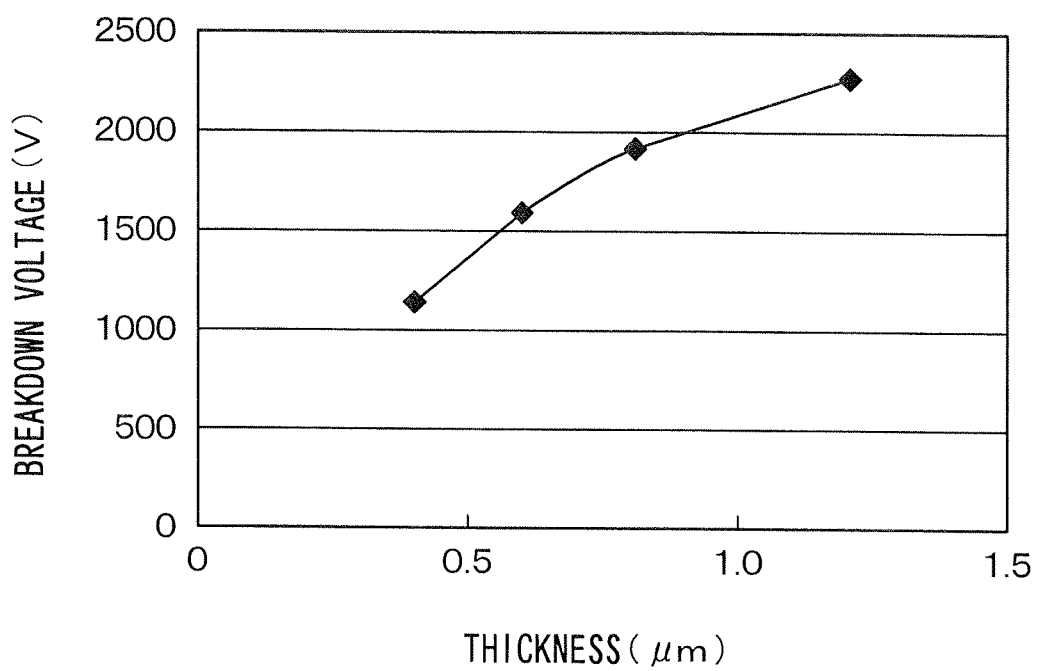
FIG. 5 is a graph showing a relationship between a thickness of an electric field relaxing layer and a breakdown voltage.

FIG. 5 is a graph showing a relationship between a thickness of the electric field relaxing layer 3a and the breakdown voltage. In this simulation, the impurity concentration of the p type base layer 3 and the electric field relaxing layer 3a is $1\times10^{17}$ cm$^{-3}$.

As shown in FIG. 4, the breakdown voltage basically depends on the impurity concentration of the electric field relaxing layer 3a. However, when the thickness of the electric field relaxing layer 3a is too small, a predetermined breakdown voltage may not be achieved. This is because the breakdown voltage also depends on the whole amount of impurities included in the electric field relaxing layer 3a. Thus, as shown in FIG. 5, the breakdown voltage is reduced with decrease in the thickness of the electric field relaxing layer 3a. For example, in a case where the impurity concentration of the p type base layer 3 and the electric field relaxing layer 3a is $1\times10^{17}$ cm$^{-3}$, when the thickness of the electric field relaxing layer 3a is 0.4 μm, the breakdown voltage is 1200 V. Thus, for example, in the case where the impurity concentration of the p type base layer 3 and the electric field relaxing layer is $1\times10^{17}$ cm$^{-3}$, a desired voltage can be achieved by setting the thickness of the electric field relaxing layer 3a to be greater than or equal to 0.4 μm.

In the above description, the impurity concentration and the thickness of the electric field relaxing layer 3a are determined so as to achieve a breakdown voltage of greater than or equal to 1200 V. However, a desired breakdown voltage may vary, and the impurity concentration and the thickness of the electric field relaxing layer 3a may be changed in accordance with the desired breakdown voltage.

Next, a manufacturing method of the SiC semiconductor device according to the present embodiment will be described with reference to FIG. 6A to FIG. 8B.

Figure 6A:
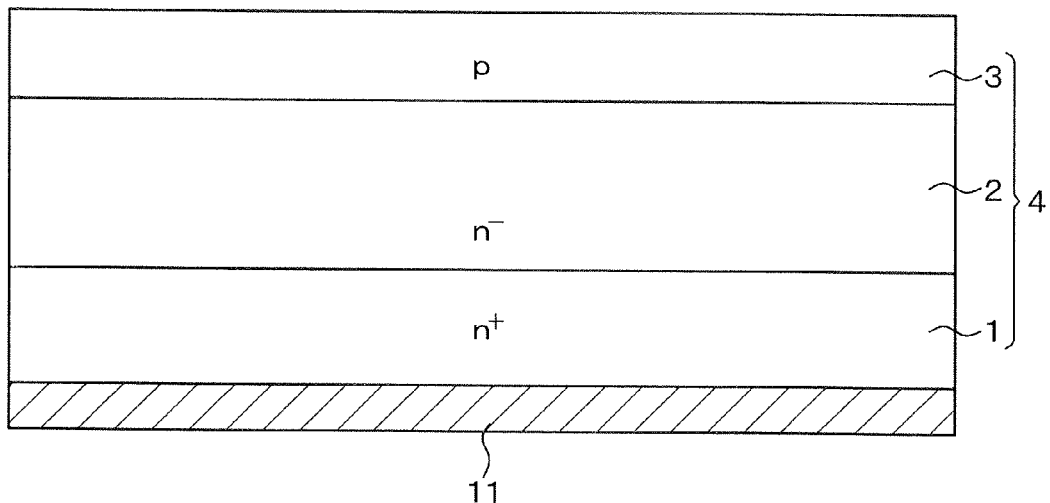
FIG. 6A and FIG. 6B are diagrams showing processes of manufacturing the SiC semiconductor device shown in FIG. 1.

In a process shown in FIG. 6A, the semiconductor substrate 4 in which the n− type drift layer 2 and the p type base layer 3 are stacked above the front surface of the n+ type substrate 1 in order is prepared. The n+ type substrate 1 has an impurity concentration of, for example, greater than or equal to $1\times10^{19}$ cm$^{-3}$, the n− type drift layer 2 has an impurity concentration of, for example, from $1\times10^{15}$ cm$^{-3}$ to $5\times10^{18}$ cm$^{-3}$, and the p type base layer 3 has an impurity concentration of, for example, from $1\times10^{16}$ cm$^{-3}$ to $5\times10^{18}$ cm$^{-3}$. The n− type drift layer 2 and the p type base layer 3 can be formed above the front surface of the n+ type substrate 1 by epitaxial growth. On the rear surface of the semiconductor substrate 4, the drain electrode 11 is formed.

Figure 6B:
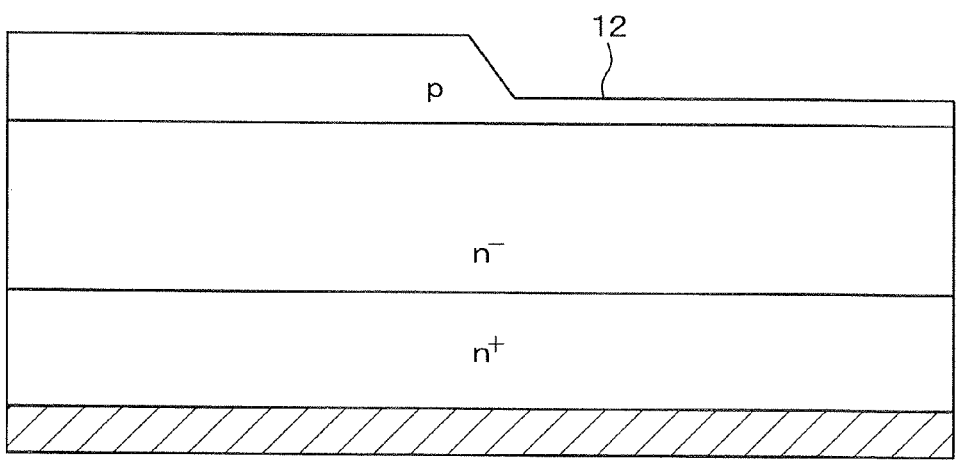

In a process shown in FIG. 6B, a mask made of, for example, low temperature oxide (LTO) is formed on the surface of the p type base layer 3. The mask is opened at a portion where the recess portion 12 is to be formed by a photolithography process. Then, the semiconductor substrate 4 is treated with etching such as reactive ion etching (RIE) with the mask, and the recess portion 12 is formed. Then, the mask is removed.

Figure 7A:
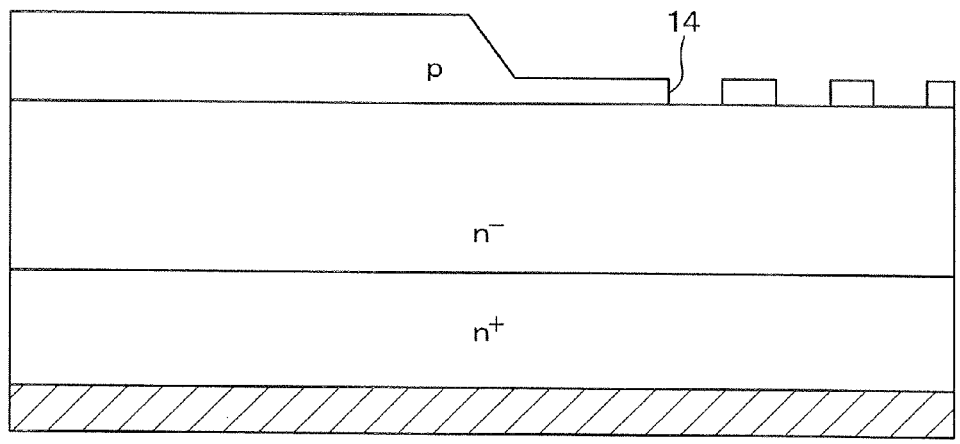
FIG. 7A and FIG. 7B are diagrams showing process of manufacturing the SiC semiconductor device following the process shown in FIG. 6B.

In a process shown in FIG. 7A, a mask made of LTO is formed on the surface of the p type base layer 3, and the mask is opened at a portion where the electric field terminal part 13 is to be formed by a photolithography process. Then, the semiconductor substrate 4 is treated with etching such as RIE with the mask, and the grooves 14 are provided in the recess portion 12. Then, the mask is removed.

Figure 7B:
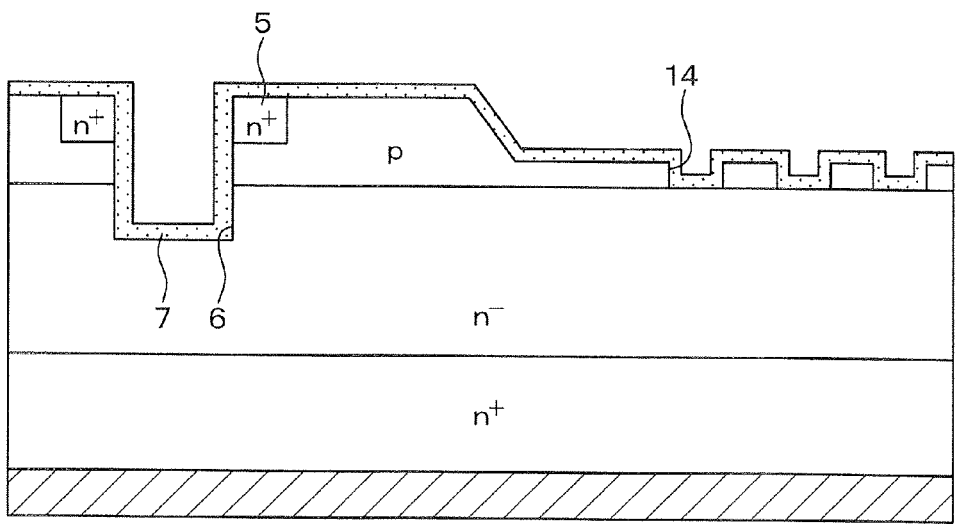

In a process shown in FIG. 7B, a mask having an opening at a portion where the n+ type source region 5 is to be formed is disposed, and an ion implantation process of n type impurities such as nitrogen and an activation process of the n type impurities are performed. Accordingly, the n+ type source region 5 is formed at a predetermined region in the surface portion of the p type base layer 3 in the cell region. After the mask is removed, a mask having an opening at a portion where the trench 6 is to be formed is disposed, and etching is performed with the mask. Accordingly, the trench 6 is formed. After that, the mask is removed, and the gate insulating layer 7 is formed by gate oxidation. At this process, the insulating layer is formed not only in the cell region but also in the peripheral region, and thereby a part of the insulating member 15 is formed in the grooves 14.

Figure 8A:
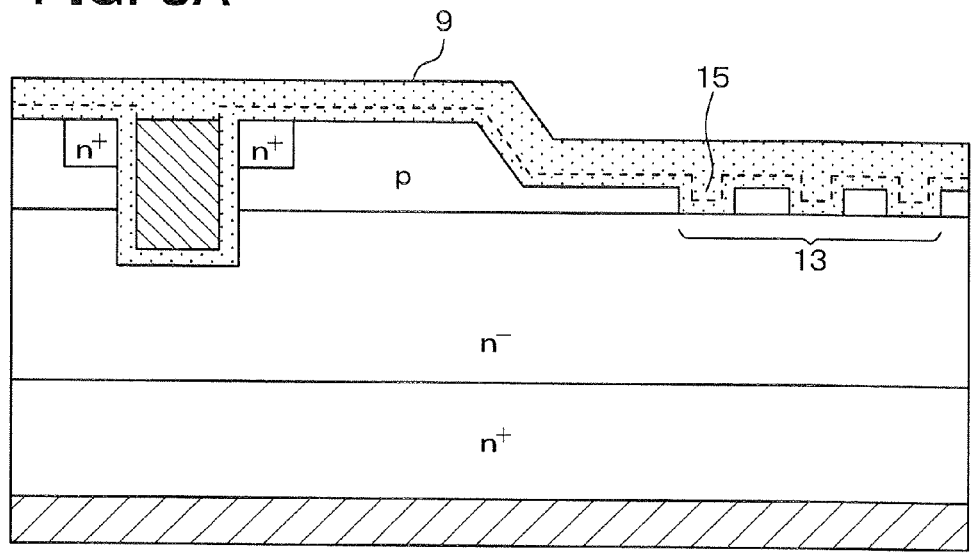
FIG. 8A and FIG. 8B are diagrams showing processes of manufacturing the SiC semiconductor device following the process shown in FIG. 7B.

In a process shown in FIG. 8A, a doped polysilicon layer is formed in the whole area of the cell region and the peripheral region. The doped polysilicon layer is treated with etching or patterning with a mask, and thereby the gate electrode 8 is formed. Then, the interlayer insulating layer 9 made of, for example, LTO is formed in the whole are of the cell region and the peripheral region by deposition. Accordingly, the grooves 14 are fully filled with the insulating member 15, and the electric field terminal part 13 is formed.

Figure 8B:
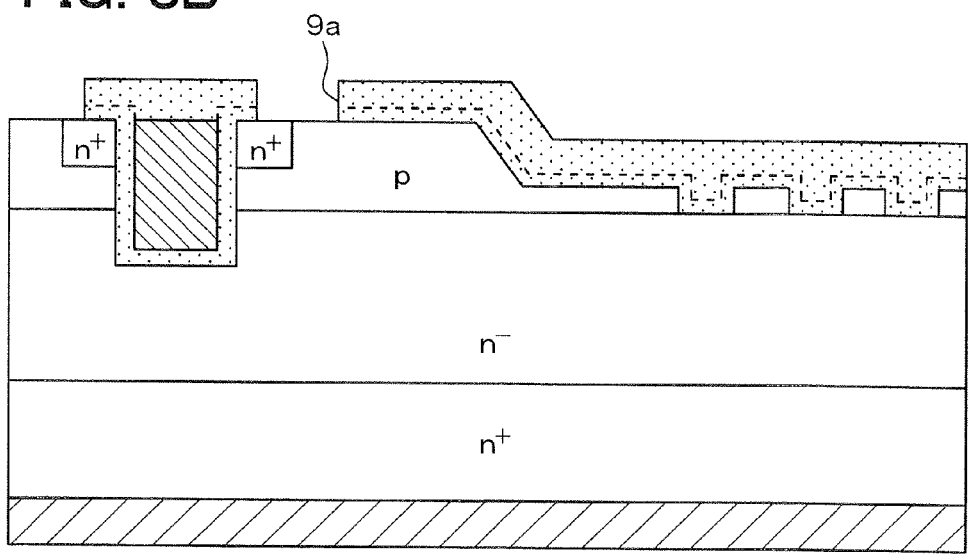

In a process shown in FIG. 8B, a mask having an opening at a portion where the contact hole 9a and other holes are to be formed is disposed on the surface of the interlayer insulating layer 9. The interlayer insulating layer 9 is treated with patterning with the mask, and thereby the contact hole 9a and the other holes are provided.

After that, the source electrode 10 is formed on the surface of the interlayer insulating layer 9. Accordingly, the source electrode 10 is disposed also in the contact hole 9a, and the source electrode 10 is electrically coupled with the n+ type source region 5 and the p type base layer 3. By the above-described way, the SiC semiconductor device according to the present embodiment can be formed.

As described above, in the SiC semiconductor device according to the present embodiment, the electric field relaxing layer 3a for forming the high breakdown voltage structure in the peripheral region is provided by the portion of the p type base layer 3 having the flat bottom face. Thus, the electric field relaxing layer 3a does not have a bending portion. Furthermore, because the n− type drift layer 2 is only a semiconductor being in contact with the electric field relaxing layer 3a, there is no discontinuous point where material having different conductivity types are connected with each other. Therefore, the breakdown voltage of the SiC semiconductor device can be further improved.

Second Embodiment

A SiC semiconductor device according to a second embodiment will be described. In the present embodiment, a configuration of an electric field terminal part 13 is changed from the first embodiment, and other parts of the SiC semiconductor device are similar to those of the first embodiment. Thus, only a part different the first embodiment will be described.

Figure 9:
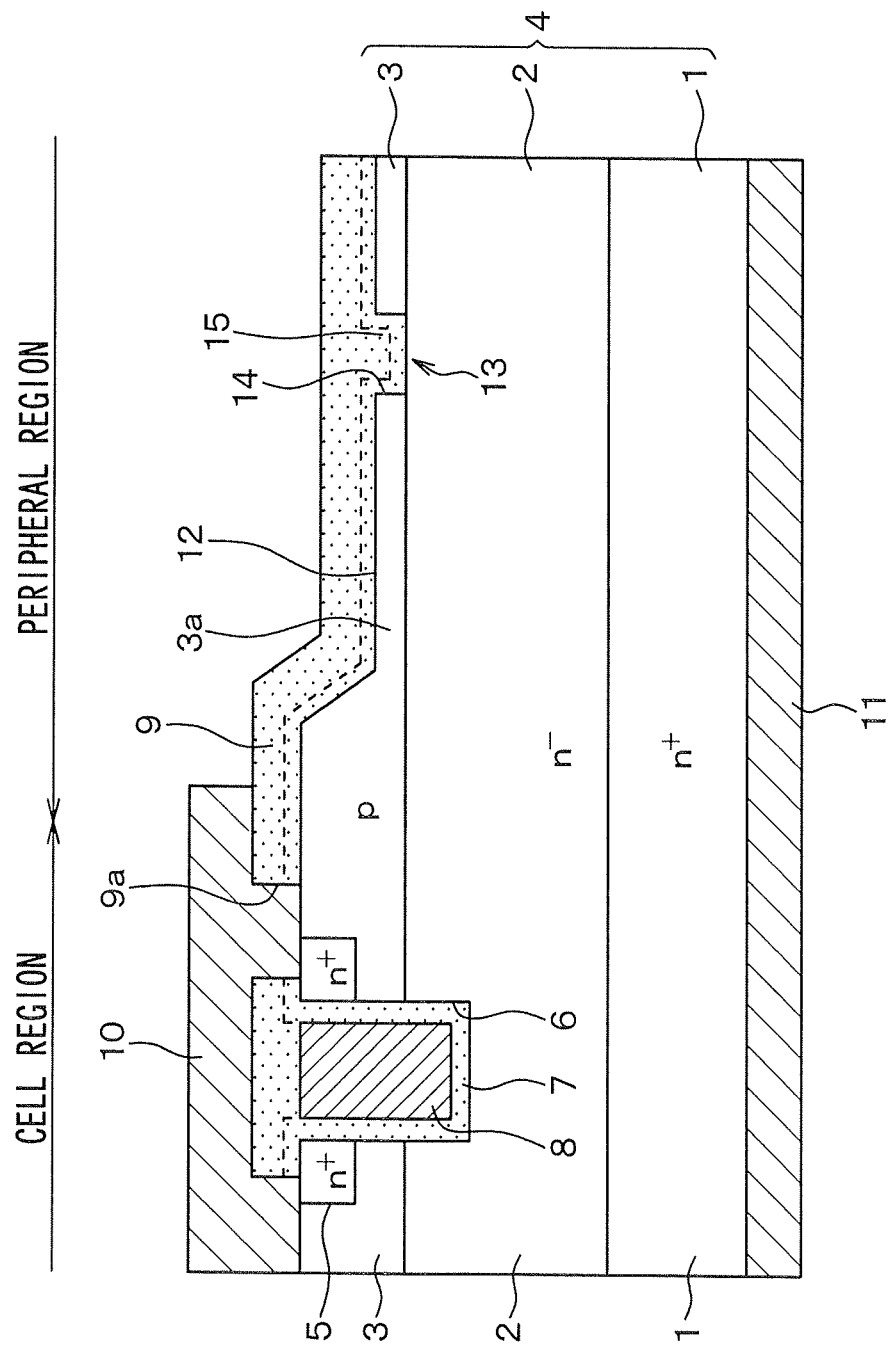
FIG. 9 is a cross-sectional view of a SiC semiconductor device according to a second embodiment.

FIG. 9 is a cross-sectional view of the SiC semiconductor device according to the present embodiment. As shown in FIG. 9, the electric field terminal part 13 includes only one groove 14 filled with the insulating member 15, and the groove 14 has a frame shape. In this way, the electric field terminal part 13 does not need to have a plurality of grooves 14 filled with the insulating member 15 and may also have one groove 14 filled with the insulating member 15.

A manufacturing method of the SiC semiconductor device according to the present embodiment is almost similar to the manufacturing method of the SiC semiconductor device according to the first embodiment. However, in the process of forming the groove 14 shown in FIG. 7A, a mask pattern is changed so that only one groove 14 is formed.

Third Embodiment

A SiC semiconductor device according to a third embodiment will be described with reference to FIG. 10. In the present embodiment, a configuration of an electric field terminal part 13 is changed from the first embodiment, and other parts of the SiC semiconductor device are similar to those of the first embodiment. Thus, only a part different the first embodiment will be described.

Figure 10:
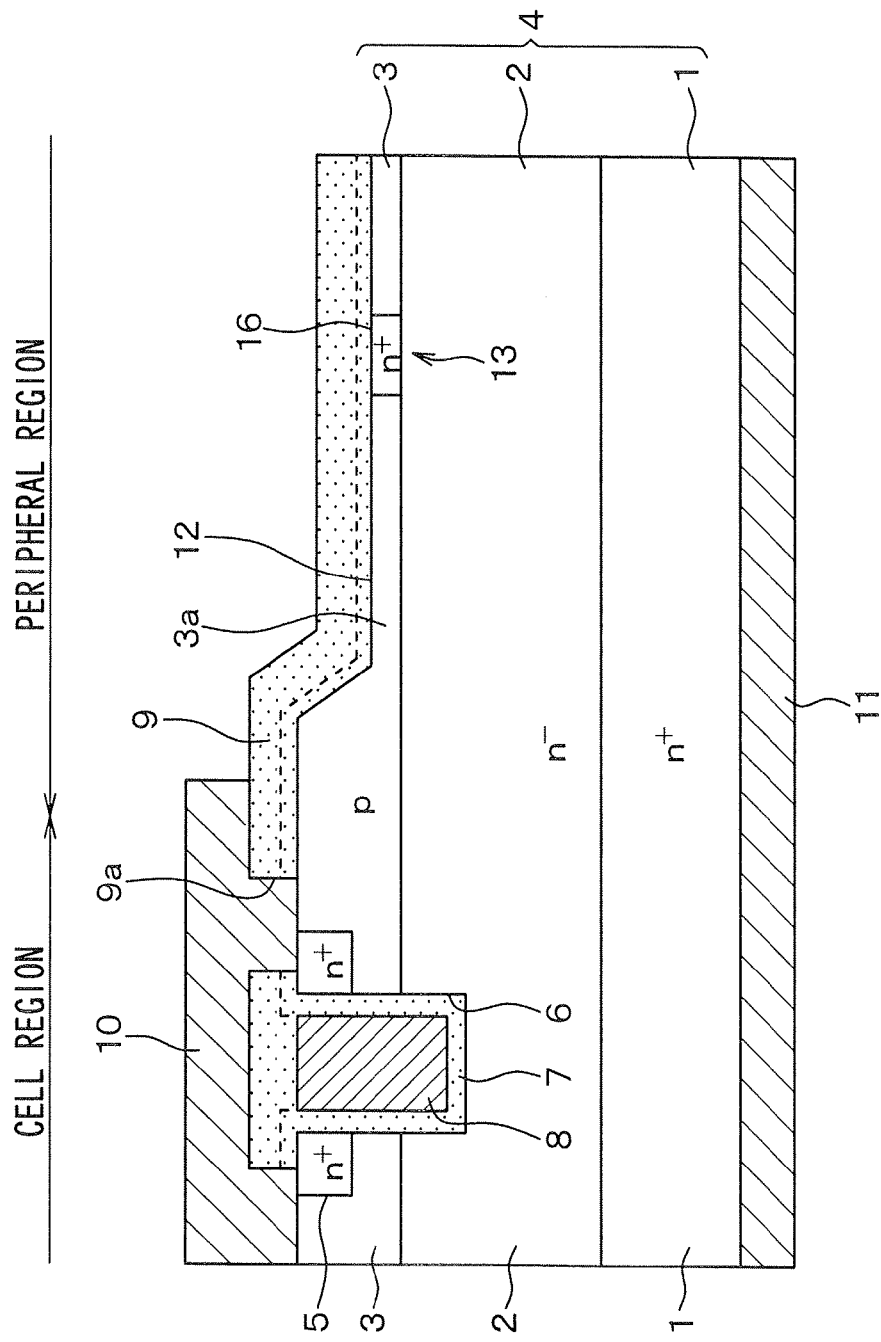
FIG. 10 is a cross-sectional view of a SiC semiconductor device according to a third embodiment.

FIG. 10 is a cross-sectional view of the SiC semiconductor device according to the present embodiment. As shown in FIG. 10, in the present embodiment, an electric field terminal part 13 includes an n+ type layer 16. The n+ type layer 16 can be formed, for example, by implanting n type impurities after forming the recess section 12 and activating the n type impurities by a heat treatment.

In this way, the electric field terminal part 13 may also be formed of the n+ type layer 16 having a different conductivity type from the electric field relaxing layer 3a.

A manufacturing method of the SiC semiconductor device according to the present embodiment is almost similar to the manufacturing method of the SiC semiconductor device according to the first embodiment. However, a process of forming the n+ type layer 16 is performed instead of the process of forming the grooves 14. The n+ type layer 16 can be formed, for example, by disposing a mask having an opening at a portion where the n+ type layer 16 is to be formed, implanting n type impurities through the mask, and activating the n type impurities by a heat treatment. When the n+ type layer 16 and the n+ type source region 5 are formed at the same process, the manufacturing process can be simplified.

Fourth Embodiment

A SiC semiconductor device according to a fourth embodiment will be described. In the present embodiment, a configuration of an electric field terminal part 13 is changed from the first embodiment, and other parts of the SiC semiconductor device are similar to those of the first embodiment. Thus, only a part different the first embodiment will be described.

Figure 11:
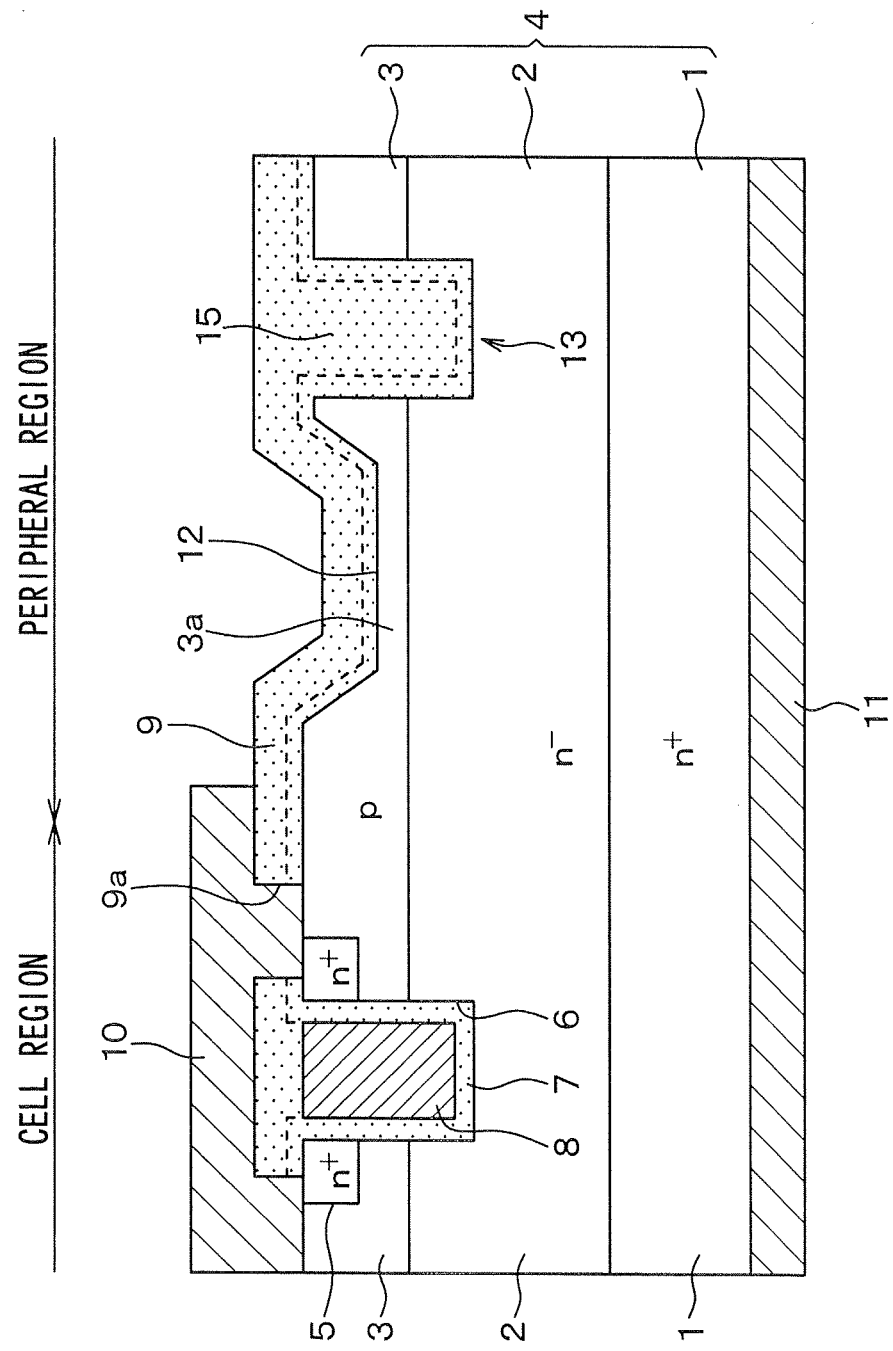
FIG. 11 is a cross-sectional view of a SiC semiconductor device according to a fourth embodiment.

FIG. 11 is a cross-sectional view of the SiC semiconductor device according to the present embodiment. As shown in FIG. 11, in the present embodiment, a recess section 12 for forming a mesa structure is not provided in the whole area of a peripheral region but is provided at the inside of an outermost portion of the peripheral region, and an electric field terminal part 13 is disposed outside the recess section 12.

In this way, the electric field terminal part 13 may also be disposed outside the recess section 12 for forming the mesa structure.

A manufacturing method of the SiC semiconductor device according to the present embodiment is almost similar to the manufacturing method of the SiC semiconductor device according to the first embodiment. However, a process of forming a groove 14 is different from the first embodiment. In the first embodiment, the grooves 14 are formed at the process next to the process of forming the recess section 12. However, in the present embodiment, the process of forming the groove 14 is performed at the same time as the process of forming the trench 6. While the gate insulating layer 7 is formed and while the interlayer insulating layer 9 is formed, the insulating member 15 is formed in the groove 14. When the doped polysilicon layer for forming the gate electrode 8 is formed, the doped polysilicon layer is disposed also in the groove 14. However, when the doped polysilicon layer is treated with patterning, the doped polysilicon layer in the groove 14 is removed.

Fifth Embodiment

A SiC semiconductor device according to a fifth embodiment will be described. In the present embodiment, a configuration of an electric field terminal part 13 is changed from the fourth embodiment, and other parts of the SiC semiconductor device are similar to those of the fourth embodiment. Thus, only a part different the fourth embodiment will be described.

Figure 12:
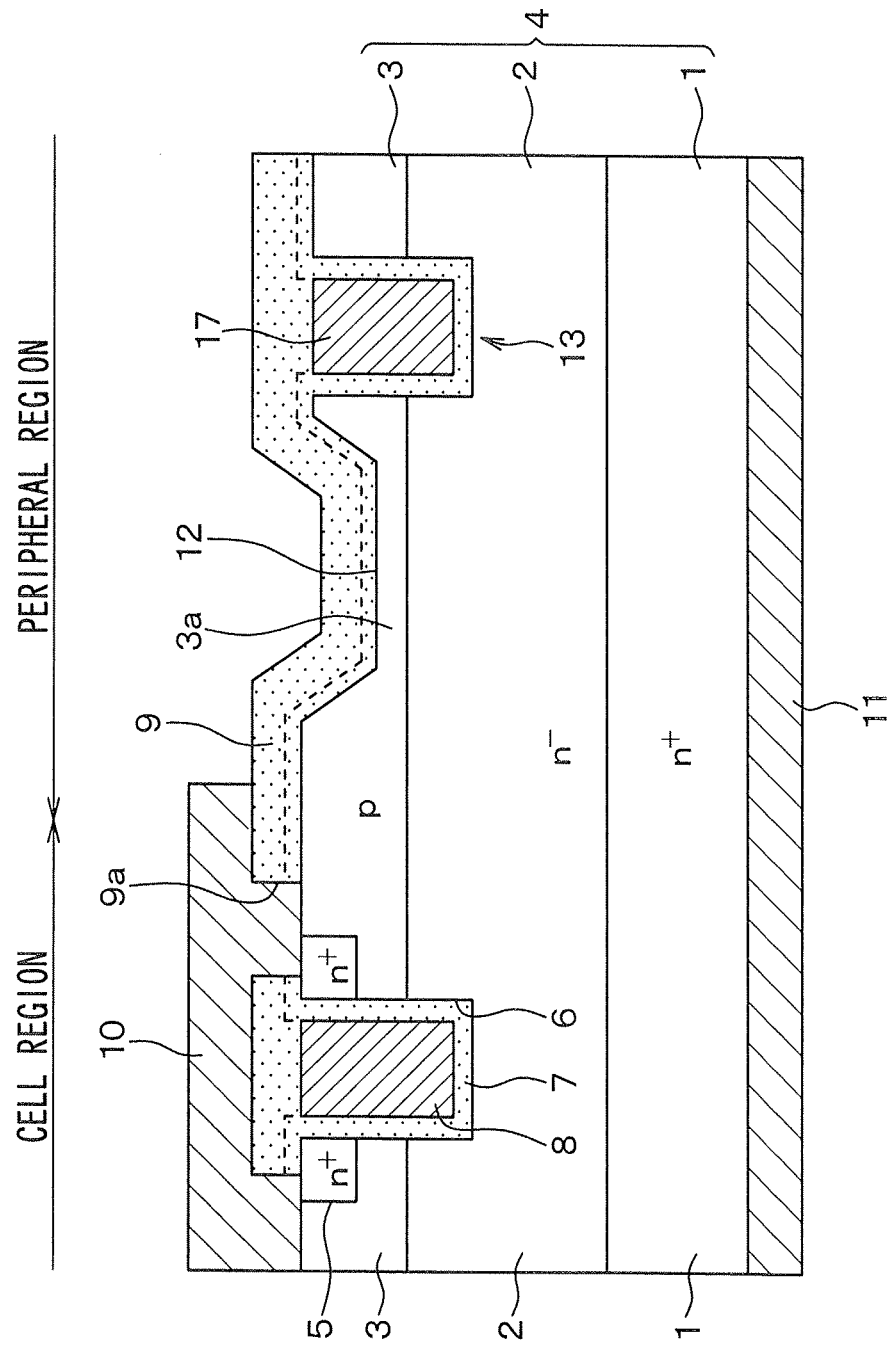
FIG. 12 is a cross-sectional view of a SiC semiconductor device according to a fifth embodiment.
Figure 13:
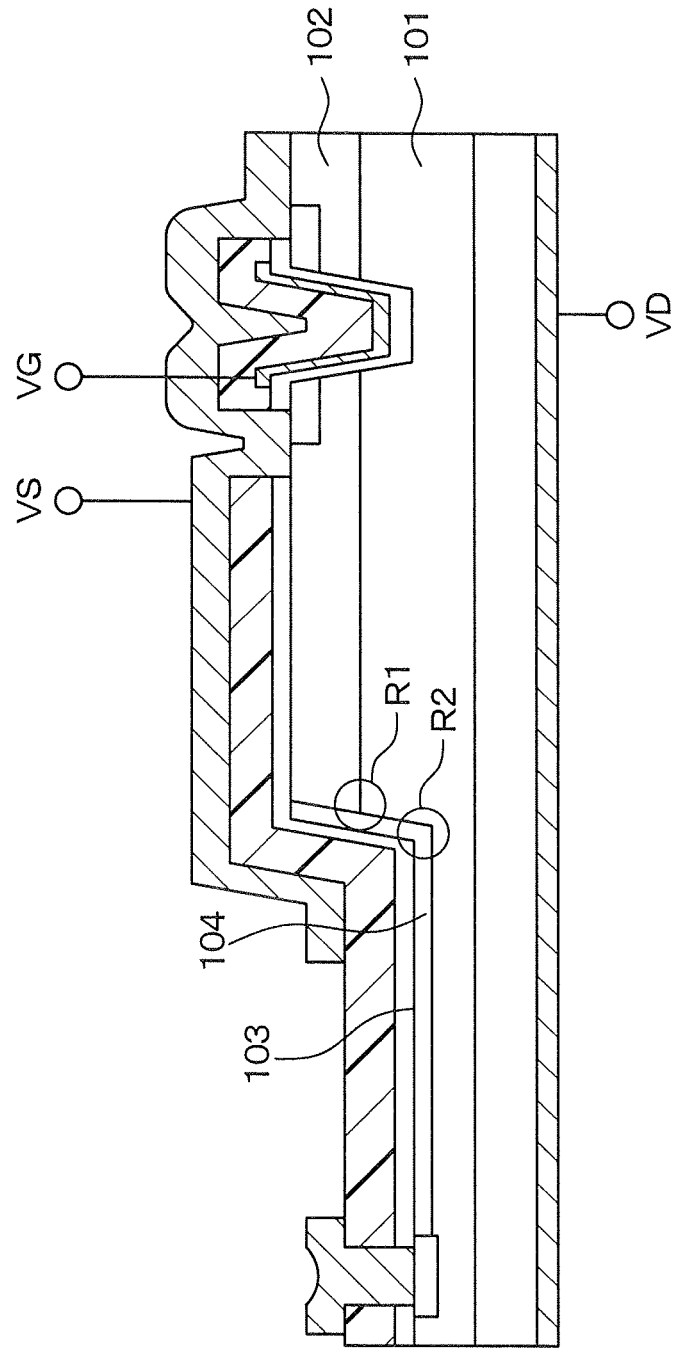
FIG. 13 is a cross-sectional view of a SiC semiconductor device according to a prior art.

FIG. 12 is a cross-sectional view of the SiC semiconductor device according to the present embodiment. In the present embodiment, a groove 14 is provided outside the recess section 12 for forming the mesa structure, and the groove 14 is filled with the gate insulating layer 7 and a polysilicon layer 17 in a manner similar to the trench gate in the cell region.

In this way, the electric field terminal part 13 may be disposed outside the recess section 12 for forming the mesa structure and the electric field terminal part 13 may have the same structure as the trench gate formed in the cell region.

A manufacturing method of the SiC semiconductor device according to the present embodiment is almost similar to the manufacturing method of the SiC semiconductor device according to the fourth embodiment. In the fourth embodiment, the doped polysilicon layer that is formed in the groove 14 when the gate electrode 8 is formed is removed. However, in the present embodiment, the doped polysilicon layer in the groove 14 is not removed and remains as the polysilicon layer 17.

Other Embodiments

Although the present invention has been fully described in connection with the preferred embodiments thereof with reference to the accompanying drawings, it is to be noted that various changes and modifications will become apparent to those skilled in the art.

Each semiconductor device according to the above-described embodiments includes the vertical power MOSFET as an example of a semiconductor element disposed in the cell region. Each semiconductor device may include a semiconductor element having other structure as long as the semiconductor element includes the p type base layer 3. For example, each semiconductor devices may also include an IGBT in which the conductivity type of the n+ type substrate 1 is inverted to a p type or a PN diode in which the p type base layer 3 functions as an anode and the n− type drift layer 2 and the n+ type substrate 1 function as cathodes.

Each semiconductor device according to the above-described embodiments includes the recess section 12 for forming the mesa structure. The recess section 12 for forming the mesa structure may be omitted from each semiconductor device.

In each semiconductor device according to the above-described embodiments, a first conductivity type is the n type, and a second conductivity type is the p type as an example. The conductivity type of each component may be inversed.

Each semiconductor device according to the above-described embodiments is made of SiC which is a wide band gap semiconductor. Each semiconductor device may also be made of GaN or diamond, which are wide bad gap semiconductor having potential of achieving a high breakdown voltage.

What is claimed is:

1. A semiconductor device comprising:
a semiconductor substrate including a substrate, a drift layer of a first conductivity type disposed on a surface of the substrate, and a base layer of a second conductivity type disposed on a surface of the drift layer; and
an electric field terminal part, wherein
the semiconductor substrate is divided into a cell region in which a semiconductor element is disposed and a peripheral region that surrounds the cell region,
the base region has a bottom face located on a same plane throughout the cell region and the peripheral region,
a portion of the base region located in the peripheral region provides an electric field relaxing layer,
the electric field terminal part is disposed in the peripheral region, the electric field terminal part surrounds the cell region and a portion of the electric field relaxing layer, and
the electric field terminal part penetrates the electric field relaxing layer from a surface of the electric field relaxing layer to the drift layer, wherein the electric field relaxing layer reaches a channel forming part of the cell region.

2. The semiconductor device according to claim 1, wherein the electric field terminal part includes at least one groove penetrating the electric field relaxing layer from the surface of the electric field relaxing layer to the drift layer and an insulating member disposed in the at least one groove.

3. The semiconductor device according to claim 2, wherein the at least one groove includes a plurality of grooves,
the insulating member is disposed in each of the plurality of grooves, and
the plurality of grooves concentrically surrounds the cell region and the portion of the electric field relaxing layer.

4. The semiconductor device according to claim 1, wherein the electric field terminal part includes a first conductivity type layer that penetrates the electric field relaxing layer from the surface of the electric field relaxing layer to the drift layer.

5. The semiconductor device according to claim 1, wherein the semiconductor substrate has a recess section in the peripheral region,
the recess section is formed by removing a portion of the base layer from a surface of the base layer so as to form a mesa structure, and
the electric field terminal part is disposed in the recess section.

6. The semiconductor device according to claim 1, wherein the semiconductor substrate has a recess section in the peripheral region,
the recess section is formed by removing a portion of the base layer from a surface of the base layer so as to form a mesa structure, and
the electric field terminal part is disposed outside the recess section.

7. The semiconductor device according to claim 5, wherein the recess section has a stepped portion adjacent to the cell region, and
the electric field terminal part is located at a distance of from 1 µm to 1000 µm from the stepped portion.

8. The semiconductor device according to claim 1, wherein the base layer and the electric field relaxing layer have an impurity concentration of from $1\times10^{16}$ cm$^{-3}$ to $2.5\times10^{17}$ cm$^{-3}$.

9. The semiconductor device according to claim 1, wherein:
the semiconductor element in the cell region is a NPN transistor.

10. The semiconductor device according to claim 9, wherein:
the NPN transistor includes a gate electrode in a trench via an insulating layer, a source region attached to the trench and disposed in a surface portion of the base layer, and a drain electrode disposed on a substrate,
the trench penetrates the base layer and reaches the drift layer,
the channel forming part of the cell region is disposed between the source region and the drift layer in the base layer, and attached to a sidewall of the trench.

11. The semiconductor device according to claim 1, wherein:

the base layer includes a plurality of thicknesses.

12. The semiconductor device according to claim 11, wherein:
the plurality of thicknesses includes a first thickness of a first part of the base layer and a second thickness of a second part of the base layer;
the first part is nearer the cell region than the second part; and
the first thickness is larger than the second thickness.

13. The semiconductor device according to claim 1, wherein:
the electric field relaxing layer reaches the channel forming part of the cell region through the portion of the base layer located in the peripheral region that provides the electric field relaxing layer.

14. The semiconductor device according to claim 1, wherein:
the electric field relaxing layer does not have a bending portion.

15. The semiconductor device according to claim 1, wherein:
of all device semiconductor layers, only the drift layer is in contact with the electric field relaxing layer.

* * * * *